US012596950B2

(12) United States Patent
Bayn et al.

(10) Patent No.: US 12,596,950 B2
(45) Date of Patent: Apr. 7, 2026

(54) QUANTUM TRANSISTOR

(71) Applicant: Quantum Transistors Technology Ltd., Herzliya (IL)

(72) Inventors: Igal Bayn, New York, NY (US); Moshe Tordjman, Haifa (IL)

(73) Assignee: Quantum Transistors Technology Ltd., Binyamina (IL)

( * ) Notice: Subject to any disclaimer, the term of this patent is extended or adjusted under 35 U.S.C. 154(b) by 402 days.

(21) Appl. No.: 18/171,351

(22) Filed: Feb. 19, 2023

(65) Prior Publication Data

US 2024/0281690 A1 Aug. 22, 2024

(51) Int. Cl.
*G06N 10/40* (2022.01)
*G02B 6/122* (2006.01)
(Continued)

(52) U.S. Cl.
CPC ........... *G06N 10/40* (2022.01); *G02B 6/1228* (2013.01); *H10D 48/383* (2025.01); *G02B 2006/12097* (2013.01); *G02B 2006/12121* (2013.01)

(58) Field of Classification Search
CPC ..... H01L 39/146; H01L 39/18; H01L 39/148; H01L 39/12; H03K 19/195; H03K 19/20; H03B 15/003; H03B 15/006; H10N 60/85
See application file for complete search history.

(56) References Cited

U.S. PATENT DOCUMENTS 6,709,918 B1 * 3/2004 Ng ........................... H10D 1/47
438/959

6,988,058 B1 * 1/2006 Sherwin ................. G06N 10/40
250/214 R
(Continued)

FOREIGN PATENT DOCUMENTS

CN 1270674 A * 10/2000 ......... H10D 48/3835
CN 202092971 U * 12/2011
(Continued)

OTHER PUBLICATIONS

Lozovik et al., "Non-volatile resonance modes of a photonic cavity in diamond produced by fine-tuning," Journal of Applied Physics, vol. 120, article No. 163107, pp. 1-7, year 2016 (Year: 2016).*
(Continued)

*Primary Examiner* — Edward Chin
(74) *Attorney, Agent, or Firm* — Meitar Patents Ltd.; Daniel Kligler

(57) ABSTRACT

A quantum computing device includes an optical resonator having a resonant wavelength band. A crystalline material including a crystal defect is contained within the optical resonator. The crystal defect has a ground state and an excited state, which has an emission wavelength in the resonant wavelength band. A source electrode and a drain electrode are disposed on opposing sides of the crystal defect and configured to apply a first electric field in the crystalline material along a longitudinal axis. A gate electrode is disposed in proximity to the crystal defect and configured to apply to the crystalline material a second electric field transverse to the longitudinal axis. Control circuitry is configured to apply a first voltage between the source and drain electrodes to control a charge state of the crystal defect and to apply a second voltage to the gate electrode to tune the emission wavelength.

24 Claims, 8 Drawing Sheets

(51) Int. Cl.
H10D 48/00 (2025.01)
G02B 6/12 (2006.01)

(56) References Cited

U.S. PATENT DOCUMENTS

| | | | | |
|---|---|---|---|---|
| 8,367,514 B2 * | 2/2013 | Goebel | H01L 21/02183 | |
| | | | 257/E21.011 | |
| 10,679,139 B2 | 6/2020 | Hutin et al. | | |
| 11,237,454 B2 | 2/2022 | Carolan et al. | | |
| 11,281,030 B2 | 3/2022 | Leipold et al. | | |
| 11,360,174 B2 | 6/2022 | Lukin et al. | | |
| 11,475,347 B1 | 10/2022 | Rudolph et al. | | |
| 11,536,897 B1 | 12/2022 | Thompson et al. | | |
| 11,768,340 B2 | 9/2023 | Patra et al. | | |
| 11,816,537 B2 | 11/2023 | Monroe et al. | | |
| 2004/0071019 A1 * | 4/2004 | Magnus | B82Y 10/00 | |
| | | | 365/200 | |
| 2004/0238962 A1 * | 12/2004 | Jung | H01L 23/5228 | |
| | | | 257/E23.161 | |
| 2008/0019648 A1 | 1/2008 | Atwater et al. | | |
| 2009/0033330 A1 * | 2/2009 | Kim | H10N 60/0184 | |
| | | | 324/318 | |
| 2009/0033369 A1 * | 2/2009 | Baumgardner | B82Y 10/00 | |
| | | | 365/162 | |
| 2009/0315337 A1 * | 12/2009 | Sines | H02N 11/002 | |
| | | | 290/1 R | |
| 2010/0295661 A1 * | 11/2010 | Subramanian | G06K 7/0008 | |
| | | | 327/183 | |
| 2012/0326116 A1 | 12/2012 | Ellis et al. | | |
| 2013/0107352 A1 * | 5/2013 | Santori | G02B 6/12007 | |
| | | | 359/346 | |
| 2013/0182464 A1 * | 7/2013 | Woias | H02M 3/3382 | |
| | | | 363/21.17 | |
| 2013/0234292 A1 * | 9/2013 | Wei | H01L 23/5228 | |
| | | | 257/536 | |
| 2013/0266328 A1 * | 10/2013 | Paller | H04B 10/25 | |
| | | | 398/135 | |
| 2014/0113828 A1 * | 4/2014 | Gilbert | G01K 7/006 | |
| | | | 252/500 | |
| 2014/0324766 A1 * | 10/2014 | Alboszta | G06N 7/01 | |
| | | | 706/57 | |
| 2015/0256270 A1 * | 9/2015 | Paller | H04B 10/90 | |
| | | | 398/202 | |
| 2015/0293236 A1 * | 10/2015 | Cecil | G01T 1/1606 | |
| | | | 216/13 | |
| 2017/0045591 A1 | 2/2017 | Jelezko et al. | | |
| 2018/0275341 A1 * | 9/2018 | Demaray | G02B 6/1228 | |
| 2019/0035999 A1 * | 1/2019 | Najafi | H10N 60/35 | |
| 2019/0086487 A1 * | 3/2019 | Jamali | H01P 11/003 | |
| 2019/0089031 A1 * | 3/2019 | Tcaciuc | H10N 60/30 | |
| 2020/0116623 A1 * | 4/2020 | Cooper-Roy | G06N 10/70 | |
| 2020/0176662 A1 * | 6/2020 | Dayton | H10N 60/35 | |
| 2021/0018767 A1 | 1/2021 | Peng et al. | | |
| 2021/0217809 A1 | 7/2021 | Orcutt et al. | | |
| 2021/0224678 A1 | 7/2021 | Wan et al. | | |
| 2022/0013977 A1 | 1/2022 | Zhou et al. | | |
| 2022/0206361 A1 | 6/2022 | Shen et al. | | |
| 2022/0365379 A1 | 11/2022 | Danner et al. | | |
| 2023/0393447 A1 | 12/2023 | Thompson et al. | | |
| 2024/0005187 A1 | 1/2024 | Shabani et al. | | |

FOREIGN PATENT DOCUMENTS

| | | | | | |
|---|---|---|---|---|---|
| CN | 104620123 B | * | 3/2018 | G01R 33/302 | |
| CN | 114676843 A | | 6/2022 | | |
| EP | 0812479 B1 | * | 1/1999 | H10N 60/128 | |
| EP | 2945160 B1 | * | 3/2017 | G11C 11/1675 | |
| GB | 2598066 A | | 2/2022 | | |
| JP | 2013152099 A | * | 8/2013 | | |
| KR | 20080004364 A | * | 1/2008 | G01R 33/035 | |
| KR | 20170070003 A | * | 6/2017 | H02K 55/00 | |
| TW | 202229949 A | | 8/2022 | | |
| WO | 2001075512 A1 | | 10/2001 | | |
| WO | WO-2013177678 A1 | * | 12/2013 | H01L 23/3738 | |
| WO | WO-2014165845 A1 | * | 10/2014 | G01R 33/282 | |
| WO | WO-2016187676 A1 | * | 12/2016 | B82Y 10/00 | |
| WO | WO-2017173548 A1 | * | 10/2017 | G01R 33/24 | |
| WO | WO-2019002576 A1 | * | 1/2019 | G01N 24/006 | |
| WO | 2021011765 A1 | | 1/2021 | | |
| WO | 2021076221 A1 | | 4/2021 | | |
| WO | WO-2022242973 A1 | * | 11/2022 | G01K 15/002 | |
| WO | 2023038767 A2 | | 3/2023 | | |
| WO | 2024170986 A1 | | 8/2024 | | |
| WO | 2024170987 A1 | | 8/2024 | | |

OTHER PUBLICATIONS

Albrecht et al., "Narrow-band single photon emission at room temperature based on a single Nitrogen-vacancy center coupled to an all-fiber-cavity," arXiv:1407.5825v1, pp. 1-4, Jul. 22, 2014 (Year: 2014).*

Liu et al., "Tailoring of typical color centers in diamond for photonics," Advanced Materials, vol. 33, No. 6, article No. 2000891, pp. 1-34, year 2020 (Year: 2020).*

Lozovik et al., "Non-volatile resonance modes of a photonic cavity in diamond produced by fine-tuning," Journal of Applied Physics, vol. 120, article No. 163107, pp. 1-7, year 2016.

Albrecht et al., "Narrow-band single photon emission at room temperature based on a single Nitrogen-vacancy center coupled to an all-fiber-cavity," arXiv:1407.5825v1, pp. 1-4, Jul. 22, 2014.

Liu et al., "Tailoring of typical color centers in diamond for photonics," Advanced Materials, vol. 33, No. 6, article No. 2000891, pp. 1-34, year 2020.

Bhaskar et al., "Quantum nonlinear optics with a germanium-vacancy color center in a nanoscale diamond waveguide," Physical Review Letters, vol. 118, article No. 223603, pp. 1-6, May 31, 2017.

Hauf et al., "Addressing single nitrogen-vacancy centers in diamond with transparent in-plane gate structures," Nano Letters, vol. 14, pp. 2359-2364, year 2014.

Nesladek, "Conventional n-type doping in diamond: state of the art and recent progress," Semiconductor Science and Technology, vol. 20, pp. R19-R27, year 2005.

International Application # PCT/IB2024/051005 Search Report dated May 23, 2024.

International Application # PCT/IB2024/051006 Search Report dated May 27, 2024.

Non-Final Office Action, # U.S. Appl. No. 18/542,889, dated Nov. 20, 2025.

List of References cited by the Examiner, # U.S. Appl. No. 18/542,889, dated Nov. 20, 2025.

Zhang et al., "Material Platforms for Defect Qubits and Single-Photon Emitters," Applied Physics Reviews, vol. 7, pp. 031308-1-031308-30, Sep. 21, 2020.

Chatterjee et al., "Semiconductor Qubits in Practice," Nature Reviews—Physics, vol. 3, pp. 157-177, Mar. 2021.

Ruf et al., "Quantum Networks Based on Color Centers in Diamond," Journal of Applied Physics, vol. 130, pp. 07091-1-070901-20, year 2021.

Wolfowicz et al., "Quantum Guidelines for Solid-State Spin Defects," Nature—Reviews, vol. 6, pp. 906-925, Oct. 2021.

Mouradian et al., "Rectangular Photonic Crystal Nanobeam Cavities in Bulk Diamond," Applied Physics Letters, vol. 111, issue 2, pp. 021103-1-021103-4, year 2017.

Wan et al., "Large-scale Integration of Artificial Atoms in Hybrid Photonic Circuits," NATURE, vol. 583, pp. 226-234, Jul. 8, 2020.

Schrinner et al., "Integration of Diamond-Based Quantum Emitters with Nanophotonic Circuits," Nano Letters, ACS Publications, vol. 20, pp. 8170-8177, year 2020.

Pezzagna et al., "Quantum Computer based on Color Centers in Diamond," Applied Physics Reviews, vol. 8, pp. 1-18, year 2021.

Lee et al., "A Quantum Router Architecture for High-Fidelity Entanglement Flows in Quantum Networks," NATURE, vol. 75, pp. 1-8, year 2022.

Walsh, "Statistical Metrology and Process Control of Quantum Devices," Doctoral Thesis, Department of Electronic Engineering and Computer Science, Massachusetts Institute of Technology, pp. 1-187, May 2020.

(56)     References Cited

OTHER PUBLICATIONS

Choi et al., "Percolation-Based Architecture for Cluster State Creation using Photon-Mediated Entanglement between Atomic Memories, " NATURE, vol. 104, pp. 1-7, year 2019.

Choi et al., "Supplemental Information—Percolation-Based Architecture for Cluster State Creation using Photon—Mediated Entanglement between Atomic Memories," pp. 1-27, Sep. 20, 2019.

Mouradin et al., "Rectangular Photonic Crystal Nanobeam Cavities in Bulk Diamond," Applied Physics Letters, vol. 111, issue 2, pp. 021103-1-021103-4, year 2017.

Bayn et al., "Fabrication of Triangular Nanobeam Waveguide Networks in Bulk Diamond Using Single-Crystal Silicon Hard Masks," Applied Physics Letters, vol. 105, pp. 211101-1-211101-5, year 2014.

Bayn et al., "Triangular Nanobeam Photonic Cavities in Single-Crystal Diamond," New Journal of Physics, vol. 13, Issue 2, pp. 1-14, year 2011.

Faraon et al., "Coupling of Nitrogen-Vacancy Centers to Photonic Crystal Cavities in Monocrystalline Diamond," Physics Review Letters, vol. 109, pp. 1-14, year 2012.

Bayn et al., "Ultra High-Q Photonic Crystal Nanocavity Design: The Effect of a Low-& Slab Material," Optics Express, vol. 16, No. 7, pp. 1-9, year 2008.

Zhang et al., "High-Fidelity single-shot Readout of single Electron spin in Diamond with spin-to-charge Conversion," Nature Communications, pp. 1-6, year 2021.

Khanaliloo et al., "Single-Crystal Diamond Nanobeam Waveguide Optomechanics," Physical Review X, vol. 5, issue 4, pp. 041051-1-041051-21, year 2015.

Dusanowski Lukasz et al: "On-Chip Hong-Ou-Mandel Interference from Separate Quantum Dot Emitters in an Integrated Circuit", ACS Photonics, vol. 10, No. 8, Jun. 21, 2023, pp. 2941-2947.

Govdeli Alperen et al: "Room-temperature waveguide-coupled silicon single-photon avalanche diodes", npj Nanophotonics, vol. 1, No. 1, Jan. 25, 2024, pp. 1-10.

European Patent Office (EPO) Communication (Form 1507).

European Search Report (ESR) for European Patent Application No. EP 25 16 4235, dated Jul. 8, 2025.

International Search Report and the Written Opinion of the International Searching Authority for International Application No. PCT/IL2024/051196, dated May 6, 2025.

Li et al., "Heterogeneous Integration of Spin-photon Interfaces with a Scalable CMOS Platform," arXiv:2308.14289v2, pp. 1-26, Dec. 20, 2023.

Zgonik et al., "Dielectric, Elastic, Piezoelectric, Electro-optic, and Elasto-optic Tensors of BaTiO3 Crystals," Physical Review B, vol. 50, No. 9, Sep. 1, 1994.

Chen et al., "Surface Transfer Doping of Semiconductors," Progress in Surface Science, vol. 84, pp. 279-321, year 2009.

Karvounis et al., "Barium Titanate Nanostructures and Thin Films for Photonics," Advanced Optical Materials, vol. 8, pp. 1-23, year 2020.

Yanikgonul et al., "2D Monte Carlo Simulation of Silicon Waveguide-based Single-photon Avalanche Diode for Visible Wavelengths," Optics Express, vol. 26, No. 12, pp. 15232-15246, Jun. 2018.

Sutula et al., "Large-scale Optical Characterization of Solid-state Quantum Emitters," arXiv:2210.13643v1, pp. 1-17, Oct. 24, 2022.

* cited by examiner

QUANTUM TRANSISTOR

FIELD

The present invention relates generally to quantum computing, and particularly to solid-state qubits.

BACKGROUND

Quantum computers apply principles of quantum physics in solving computational problems and have the potential to perform certain computations far more efficiently than existing digital (classical) computers. The basic building block of a quantum computer is the qubit. Quantum computers comprise quantum gates built up from qubits, including single-qubit, two-qubit, and multi-qubit gates.

Various different physical systems have been proposed and developed to realize qubits, such as superconducting circuits, trapped ions and atoms, and solid-state crystal defects, such as lattice vacancies in diamond and other semiconductor materials. This defect-based realization is advantageous in that t it enables compact qubits to be created in a solid and to operate up to room temperature (i.e., from $4°$ K up to $300°$ K). A variety of different defect types have been proposed and evaluated for this purpose.

One of the most promising types of crystal defects for quantum computing is the Nitrogen Vacancy (NV) color center in diamond. To form an NV color center, a nitrogen atom is substituted for a carbon atom in the diamond crystal lattice, accompanied by a vacancy substituting a neighboring carbon atom. This structure allows electrons from the nearby carbon and nitrogen atoms to occupy the vacancy and form an "artificial atom." The charge of the NV center can be either negative ($NV^-$), neutral ($NV^0$), or positive ($NV^+$). Optical transitions between energy levels of the $NV^-$ state, together with spin-dependent relaxation processes, allow the $NV^-$ electron spin to be polarized by irradiating the color center with a green or blue laser beam, even at room temperature. Optical excitation of the $NV^-$ color center results in red photoluminescent emission, due to the transition between the $^3E$ to the $^3A_2$ triplet electronic states, with a zero-phonon line (ZPL) wavelength of approximately 637 nm. The emission intensity depends on the degree of electronic spin polarization and thus provides means to measure the electronic spin polarization in order to perform quantum computations.

In the context of the present description and in the claims, the terms "optical radiation" and "light" refer to electromagnetic radiation in any of the visible, infrared, and ultraviolet spectral ranges.

SUMMARY

Embodiments of the present invention that are described hereinbelow provide improved quantum computing devices and methods for implementation of such devices.

There is therefore provided, in accordance with an embodiment of the invention, a quantum computing device, including an optical resonator having a resonant wavelength band. A crystalline material including a crystal defect is contained within the optical resonator. The crystal defect has a ground state and an excited state, which has an emission wavelength in the resonant wavelength band. A source electrode and a drain electrode are disposed on opposing sides of the crystal defect and configured to apply a first electric field in the crystalline material along a longitudinal axis. A gate electrode is disposed in proximity to the crystal defect and configured to apply to the crystalline material a second electric field transverse to the longitudinal axis. Control circuitry is configured to apply a first voltage between the source and drain electrodes to control a charge state of the crystal defect and to apply a second voltage to the gate electrode to tune the emission wavelength.

In a disclosed embodiment, the crystalline material includes diamond, and the crystal defect includes a nitrogen vacancy (NV) defect. Application of the first voltage between the source and drain electrodes switches the NV defect between an $NV^0$ state and an $NV^-$ state.

In some embodiments, application of the first electric field with a first polarity switches the crystal defect to a first charge state, and application of the first electric field with a second polarity, opposite to the first polarity, switches the crystal defect to a second charge state having the ground state and the excited state, which has the emission wavelength in the resonant wavelength band. In a disclosed embodiment, the control circuitry is configured to apply the first voltage so as to maintain the crystal defect in the second charge state during a period of quantum computation.

Additionally or alternatively, the device includes an optical waveguide, which is configured to convey one or more excitation beams to the crystal defect at wavelengths selected to convert one or more electronic spin states of the crystal defect to respective charge states, and the controller is configured to detect the charge states of the crystal defect by measuring a current between the source electrode and the drain electrode.

Further additionally or alternatively, the optical waveguide is configured to convey one or more excitation beams to the crystal defect, including a first excitation beam at a transition wavelength of the second charge state and a second excitation beam at an infrared wavelength chosen to initialize the crystal defect in the second charge state while preventing conversion of the second charge state to the first charge state.

In a disclosed embodiment, the control circuitry is configured to adjust the second voltage so as to tune the emission wavelength of the crystal defect.

In some embodiments, the device includes a semiconductor donor layer disposed between at least one of the electrodes and the crystal defect. In one embodiment, application of the second electric field creates a two-dimensional PIN structure over the crystal defect. In some embodiments, the semiconductor donor layer includes one or more of a transition metal oxide (TMO) and a transition metal dichalcogenide (TMD).

In one embodiment, the device includes a piezoelectric element coupled to modify a length of the optical resonator, wherein the control circuitry is configured to drive the piezoelectric element to adjust the resonant wavelength band of the optical resonator.

In some embodiments, the optical resonator includes periodic structures formed in the crystalline material on opposing sides of the crystal defect. In one embodiment, the periodic structures include holes extending through a layer of the crystalline material that contains the crystal defect. In another embodiment, the periodic structures include indentations in a surface of the crystalline material.

In some embodiments, the crystalline material is configured as an optical waveguide, which is coupled to convey optical radiation emitted from the crystal defect at the emission wavelength from the optical resonator to a detector. Typically, the optical waveguide is further coupled to convey one or more excitation beams at one or more excitation wavelengths from one or more beam sources to the crystal defect.

In some embodiments, the device includes a substrate, on which the optical waveguide is disposed, an input wave-guide, which is disposed on the substrate and is coupled to inject the one or more excitation beams into the optical waveguide, and an output waveguide, which is disposed on the substrate and is coupled to receive the emitted optical radiation from the optical waveguide. In a disclosed embodiment, the optical waveguide and the input and output waveguides have tapered ends, which are overlaid on the substrate so as to inject the one or more excitation beams into the optical waveguide and inject the emitted optical radiation into the output waveguide by adiabatic coupling. Additionally or alternatively, the output waveguide includes a filter configured to block the excitation wavelength.

In a disclosed embodiment, the optical waveguide includes a ridge disposed on a slab of the crystalline material. Alternatively or additionally, the optical waveguide has a cross-sectional profile selected from a group of profiles consisting of a rectangular profile, a triangular profile, and a pentagonal profile.

In some embodiments, the device includes a photonic integrated circuit (PIC) substrate, on which the crystalline material is disposed, and one or more optical waveguides, which are disposed on the substrate and are optically coupled to the crystalline material. In a disclosed embodiment, the one or more optical waveguides include at least one inverse taper configured to couple optical radiation between the crystalline material and the one or more optical waveguides. Alternatively, the PIC includes a reflective surface, which is configured to couple optical radiation between the crystalline material and the one or more optical waveguides.

There is also provided, in accordance with an embodiment of the invention, a method for quantum computing, which includes providing a crystalline material including a crystal defect within an optical resonator. The crystal defect has a ground state and an excited state, which has an emission wavelength in a resonant wavelength band of the optical resonator. A source electrode and a drain electrode are placed on opposing sides of the crystal defect so as to apply a first electric field in the crystalline material along a longitudinal axis. A gate electrode is placed in proximity to the crystal defect so as to apply to the crystalline material a second electric field transverse to the longitudinal axis. A first voltage between the source and drain electrodes to control a charge state of the crystal defect, and a second voltage is applied to the gate electrode to tune the emission wavelength.

The present invention will be more fully understood from the following detailed description of the embodiments thereof, taken together with the drawings in which:

DETAILED DESCRIPTION

Overview

Figure 1:
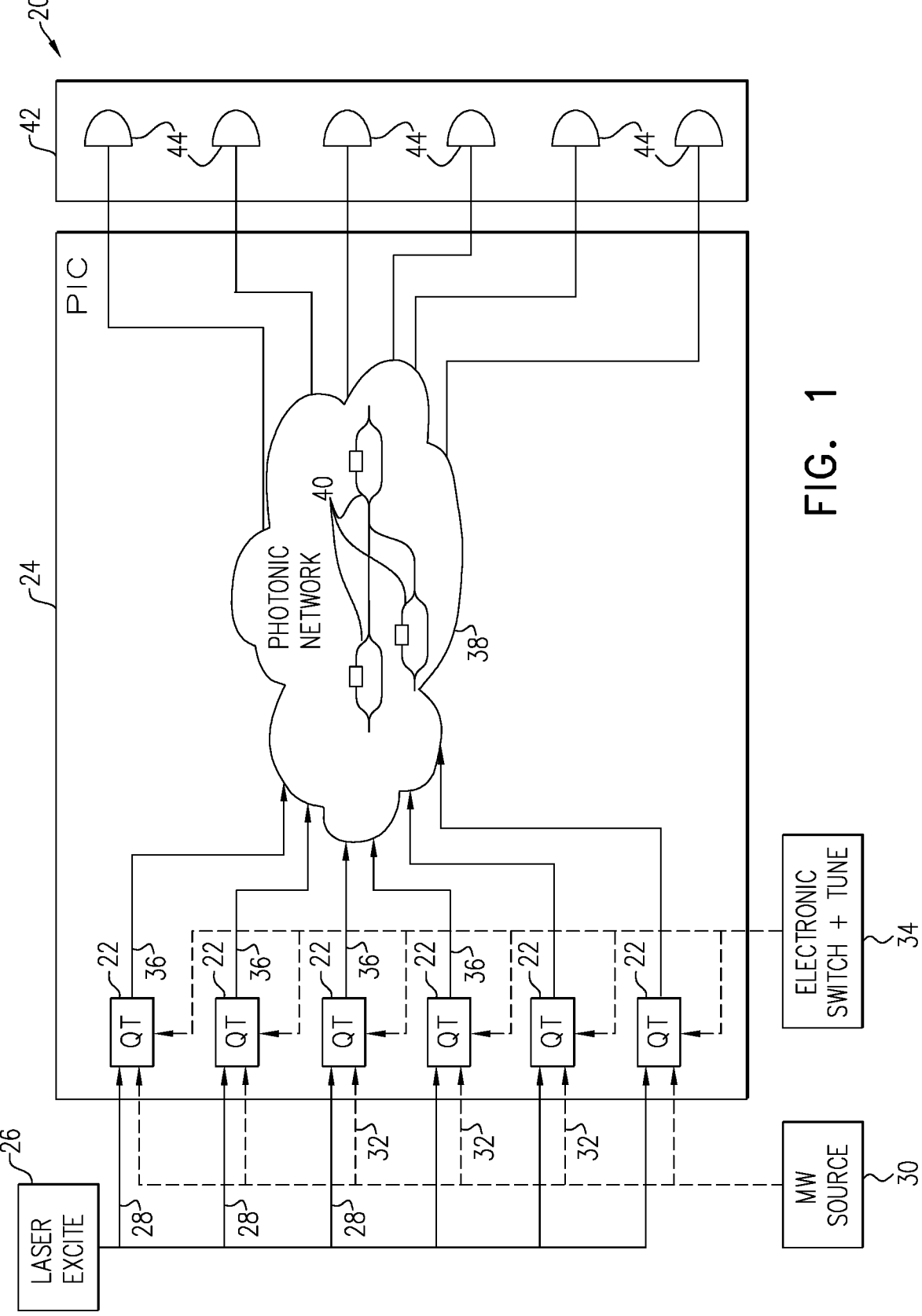
FIG. 1 is a block diagram that schematically illustrates a quantum computing system, in accordance with an embodiment of the invention.

For the sake of concreteness and clarity, the description that follows will focus on qubits based on NV color centers in diamond. These embodiments, however, are described solely by way of example. The principles of these embodiments may similarly be applied, mutatis mutandis, in qubits based on other types of color centers in diamond, as well as based on defects in other types of crystals.

Despite the promise and potential advantages of qubits based on NV defects in diamond (and other types of crystal defects), practical quantum computing devices based on NV defects have not yet been demonstrated. Experimental systems based on NV defects are still far from meeting the minimal levels of stability, efficiency, and fidelity that are needed for multi-qubit devices. A number of problems must be overcome in order to create a quantum computer based on NV defects:

Quantum efficiency—The luminescence spectrum of the $NV^-$ center comprises a zero-phonon line (ZPL) and a broad phonon sideband, which contains most of the spontaneous luminescent energy emitted from the excited triplet state. Only the ZPL has the well-defined frequency and polarization needed for qubit operations. Nonradiative losses reduce the quantum efficiency of ZPL emission still further.

Spectral diffusion—The $NV^-$ center has electric dipole moments in both the ground and the excited states. Therefore, the $NV^-$ transition frequency, on which the qubit is based, is sensitive to local electric fields, which tend to fluctuate with location, thus causing frequency variations, known as "spectral diffusion," among the qubits in a multi-qubit device. For multi-qubit entanglement and other operations, the spectral diffusion must be held within tight limits.

Charge stability—The NV center has two metastable charge states: $NV^-$ and $NV^0$. Optical excitation of the NV charge state using a laser frequently causes ionization, with a resulting transition to the $NV^0$ state and loss of quantum information.

Embodiments of the present invention that are described herein address these problems using a novel quantum computing device that is referred to herein as a "quantum transistor." Strictly speaking, the device is not a transistor in the sense in which this term is conventionally used in electronic circuits. It is referred to herein as a quantum transistor, however, because of its topological similarity to an electronic transistor, with three electrodes coupled to a solid-state core.

In the quantum transistors that are described herein, a crystal defect is contained in an optical resonator having a resonant wavelength band that contains the emission wavelength of the crystal defect (i.e., the ZPL). The resonator may comprise, for example, periodic structures formed on opposing sides of the defect in the crystalline material (such as diamond). The resonator is designed to have a high Q factor and low mode volume, to give strong Purcell enhancement of the spontaneous emission in the ZPL and thus increase the quantum efficiency of the device.

Electrodes are connected to the crystalline material, including source, drain, and gate electrodes. The source and drain electrodes are disposed on opposing sides of the crystal defect and define a longitudinal axis running through the defect. Application of a voltage between the source and drain electrodes gives rise to an electric field in the crystalline material along the longitudinal axis. Application of a voltage to the gate electrode gives rise to an additional electric field transverse to the longitudinal axis. By applying the proper voltages between the source and drain electrodes, while also applying a voltage to the gate electrode, control circuitry of the quantum transistor is able to switch the charge state of the crystal defect. Thus, an NV center in diamond, for example, can be switched reliably and stably from the $NV^0$ state to the $NV^-$ state required for qubit operations, as well as maintaining the NV center in the $NV^-$ state during a period of quantum computation.

Furthermore, by adjusting the voltage applied to the gate electrode, the control circuitry is able to tune the emission wavelength of the ZPL and thus offset the effect of spectral diffusion. In this manner, multiple qubits can be spectrally calibrated so that their ZPL frequencies are substantially identical, thus facilitating entanglement among the qubits and enabling multi-qubit operations.

In some embodiments, the optical resonator is coupled efficiently to one or more optical waveguides, which convey the optical radiation emitted from the crystal defect at the emission wavelength of the defect (for example, the red ZPL emission of the $NV^-$ defect) from the optical resonator to a detector. The optical waveguides may also convey one or more excitation n beams at appropriate excitation wavelengths of the crystal defect (for example, a green beam for exciting the $NV^-$ defect) from one or more beam sources to the crystal defect. In some embodiments, the waveguides are formed on a photonic integrate circuit (PIC) substrate, on which the crystalline material containing the defect is mounted. Multiple diamond chiplets containing respective NV defects may be mounted together on such a PIC, thus creating a multi-qubit quantum computing device, while the waveguides form a photonic network that interconnects the qubits for purposes of computing operations and output detection.

System Description

FIG. 1 is a block diagram that schematically illustrates a quantum computing system 20, in accordance with an embodiment of the invention. System 20 comprises an array of quantum transistors 22 mounted on a PIC 24. Quantum transistors 22 comprise diamond chiplets, each including an NV defect contained in an optical resonator, with electrodes connected to the chiplet, as shown in detail in the figures that follow. In some embodiments, the diamond chiplet comprises a waveguide, and the optical resonator is formed in this diamond waveguide, which couples to the PIC.

PIC 24 comprises a substrate, such as a silicon-on-insulator (SOI) substrate, on which a network of waveguides with low propagation loss is formed, for example SiN waveguides, for conveying optical radiation to and from quantum transistors 22. Alternatively, other types of substrates may be used, such as a silicon or glass substrate. In the present example, these waveguides include input waveguides 28, which inject one or more optical excitation beams, for example a green beam output by a laser 26 at around 532 nm, into quantum transistors 22 via a suitable coupler. In addition, output waveguides 36 on PIC 24 receive the radiation emitted from the quantum transistors, for example red radiation in the ZPL of the $NV^-$ defects, at approximately 637 nm via another coupler. Methods for optically coupling waveguides 28 and 36 to the diamond chiplet containing the NV defect are described further hereinbelow.

In some embodiments, multiple excitations beams are applied at different wavelengths to excite the NV defects. In one such embodiment, one excitation beam, such as a green beam at 532 nm, is applied at a transition wavelength of the $NV^-$ state, and a second excitation beam is applied at an infrared wavelength chosen to initialize the NV defect to its $NV^-$ charge state while avoiding ionizations of the charge state (i.e., preventing transition to the $NV^0$ charge state). The infrared wavelength is typically chosen in the range of 780-1900 nm, for example at 1550 nm, and is linearly polarized along a direction perpendicular to the axis of the NV defect structure (i.e., perpendicular to the axis between the nitrogen atom and the crystal vacancy).

In addition, a microwave source 30 generates a microwave input 32 to quantum transistors 22, to drive transitions between the electron spin energy levels of the $NV^-$ ground state. These transitions can be exploited both in reading the state of a qubit, for example using conversion of spin to charge state as described further hereinbelow, and in shifting the NV defects between ground and superposition states, which can be used both in single-qubit operations and in n creating entanglement between qubits.

Electronic control circuitry 34 applies electrical signals to the electrodes of quantum transistors 22 (as shown in the figures that follow) in order to switch the defect charge states and tune the emission wavelengths of the crystal defects. These functions are described further hereinbelow with reference to FIGS. 3A-C and 4.

In the pictured embodiment, output waveguides 36 couple quantum transistors 22 to a photonic network 38, which in turn connects the output signals from the quantum transistors to optical detectors 44. In the pictured example, photonic network 38 comprises optical switches 40, such as phase-controlled Mach-Zehnder interferometers. Detectors 44 may comprise, for example, high-speed avalanche photodiodes (APDs) or single-photon avalanche diodes (SPADs), which are fabricated on a separate detector chip 42 coupled optically to PIC 24. Alternatively, the optical detectors may be fabricated on PIC 24, as well. High-speed SPADs with fast quenching can be useful in overcoming spectral among diffusion the quantum transistors. The details of network 38 and detectors 44, however, are beyond the scope of the present disclosure.

Optical and Electrical Structure of a Quantum Transistor

Figures 2A, 2B, 2C:
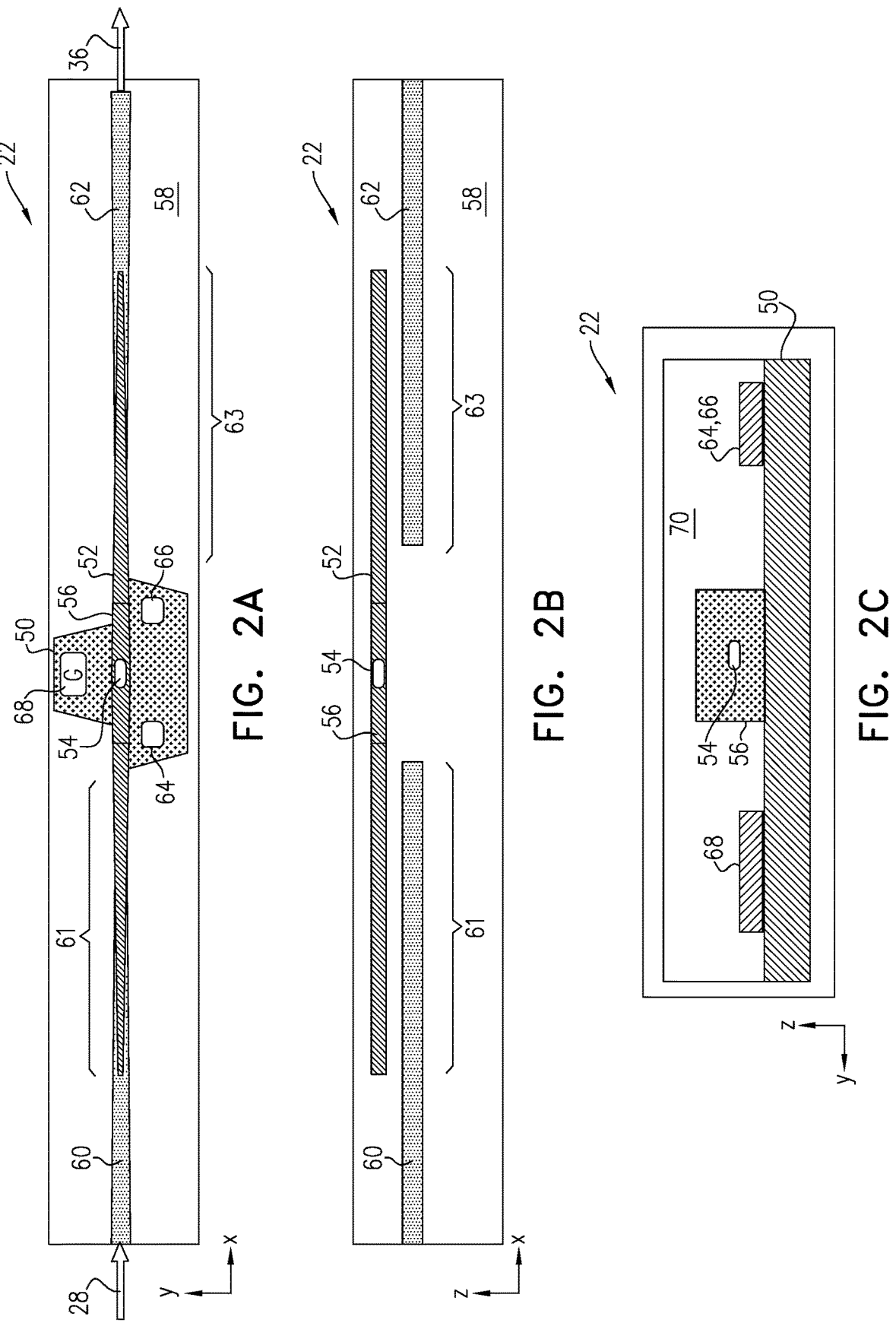
FIGS. 2A, 2B, and 2C are schematic top, side, and sectional views, respectively, of a quantum transistor, in accordance with an embodiment of the invention.

FIGS. 2A, 2B, and 2C are schematic top, side, and sectional views, respectively, of quantum transistor 22, in accordance with an embodiment of the invention. In this embodiment, an NV defect 54 is formed in a diamond waveguide 52, such as a ridge waveguide in the pictured embodiment. NV defect 54 can be formed, for example, by electron irradiation, ion nano-implantation, or pulsed laser irradiation of the diamond crystal. Waveguide 52 in this example comprises a narrow, rectangular ridge disposed on a broader slab 50 of diamond. The waveguide and slab can be produced, for example, by photolithographic etching of a diamond membrane. In a typical implementation, waveguide 52 has a length in the range of 10-50 μm, and a height and width in the range of 100-300 nm. The thickness of slab 50 beneath waveguide 52 is typically in the range of 50-150 nm. The dimensions of waveguide 52 may advantageously be chosen to support single-mode operation at both the excitation wavelength and the emission wavelength of defect 54. Alternatively, other dimensions and other types of diamond waveguides may be used, such as a strip with a rectangular (fishbone), triangular, or pentagonal cross-sectional profile.

Figure 5A:
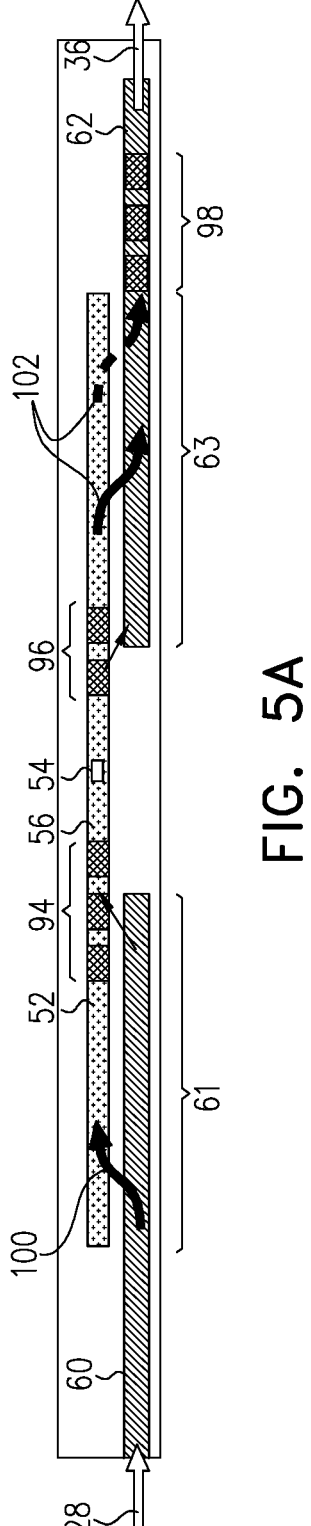
FIG. 5A is a schematic side view of waveguides in a quantum transistor showing details of an optical resonator and filter implemented in the waveguides, in accordance with an embodiment of the invention.

An optical resonator 56, containing defect 54, is formed in the central part of waveguide 52. Resonator 56 has a high-Q resonant wavelength band that contains the ZPL emission wavelength of defect 54. The wavelength band of the resonator may be tunable, for example using a piezo-electric element in as shown FIG. 8. The piezoelectric element may be positioned alongside or beneath resonator 56, or it may be formed on PIC 24. Resonator 56 is defined in the present embodiment by periodic structures formed in waveguide 52, for example as shown in FIGS. 5A/B, 6 and 7. This type of resonator is advantageous in achieving high Q and a small mode volume. Alternatively, other types of resonant structures may be used.

Input waveguide 28 and output waveguide 36 terminate in respective adiabatic tapers 60 and 62 on a PIC substrate 58 within quantum transistor 22. Tapers 60 and 62 are produced, for example, by suitable etching of the SiN layer on PIC 24. Tapers 60 and 62 are overlaid by corresponding inverse tapers of the ends of diamond waveguide 52 in respective overlap regions 61 and 63. Waveguide 52 may be separated in the Z-direction from the underlying tapers 60 and 62 by a thin dielectric layer, for example comprising $SiO_2$. The green light input through waveguide 28 is transferred adiabatically, with low loss, by evanescent wave coupling from taper 60 into the overlying part of diamond waveguide 52 in region 61; and the red light output from defect 54 is similarly transferred from diamond waveguide 52 into taper 62 in region 63. For efficient adiabatic coupling, the lengths of overlap regions 61 and 63 in the X-direction are typically in the range of 10-20 μm.

Conductive electrodes are deposited on diamond slab 50, including a source electrode 64, a drain electrode 66, and a gate electrode 68, in proximity to defect 54. Source electrode 64 and drain electrode 66 are deposited on opposing sides of defect 54, defining a longitudinal axis through their respective locations. (In the present example, this longitudinal axis runs parallel to the X-axis, but other orientations of the longitudinal axis may alternatively be used.) When a voltage is applied through an active conductive channel between source electrode 64 and drain electrode 66, it will give rise to an electric field within diamond waveguide 52 along the X-axis. Gate electrode 68 is offset from the longitudinal axis, so that a voltage applied between the gate electrode and drain electrode 66 (or between the gate electrode and source electrode 64), for example, will give rise to a transverse electric field component along the Y-direction within diamond waveguide 52.

Control circuitry 34 (FIG. 1) drives electrodes 64, 66 and 68 to control the charge state of crystal defect 54 and to tune the ZPL wavelength emitted by the crystal defect. To enable this functionality, a semiconductor hole donor layer 70 (which may be a monolayer or multilayer structure) is formed over the surface of diamond waveguide 52, between the electrodes (particularly gate electrode 68) and NV defect 54. This donor layer 70 may comprise, for example, a transition metal oxide (TMO) and/or transition metal dichalcogenide (TMD), such as $MoO_3$, $MoS_2$, $V_2O_5$, $WO_3$, $ReO_3$, $CrO_3$, $WS_2$, or $MoSe_2$, for example. Donor layer 70 may be formed by atomic layer deposition or other deposition techniques, such as thermal evaporation, sputtering, or e-beam. The TMO or TMD may be combined with two-dimensional (2D) materials such as graphene, hexagonal boron nitride, or other Vander Waals heterostructures. Alternatively, other hole donor materials (electron acceptors) may be used, or the donor layer may be formed by suitable doping of the diamond itself. A number of possible donor layer configurations are shown, by way of example, in FIGS. 3A-C.

When a suitable voltage is applied to gate electrode 68, it releases carriers from donor layer 70 in the vicinity of defect 54, thus creating a two-dimensional PIN layer structure, comprising an undoped intrinsic semiconductor region between p-type semiconductor and n-type semiconductor regions, over the defect. Depending on the electrode configuration, defect 54 can then be switched between the $NV^0$ and $NV^-$ charge states by switching the polarity of the voltage applied between source electrode 64 and drain electrode 66. In other words, applying a sufficient voltage of the proper polarity will switch defect 54 to the $NV^-$ charge state by shifting the positive and negative carrier bands via the PIN layer structure in the diamond crystal and/or in the diamond surface or interface, irrespective of the application of the excitation beam from laser 26. Applying a voltage of the opposite polarity will switch defect 54 to the $NV^0$ charge state. The polarities and magnitudes of the voltages to be applied to electrodes 64, 66 and 68 for the purposes of charge state switching depend on the geometrical and electrical characteristics of quantum transistor 22.

Figure 4:
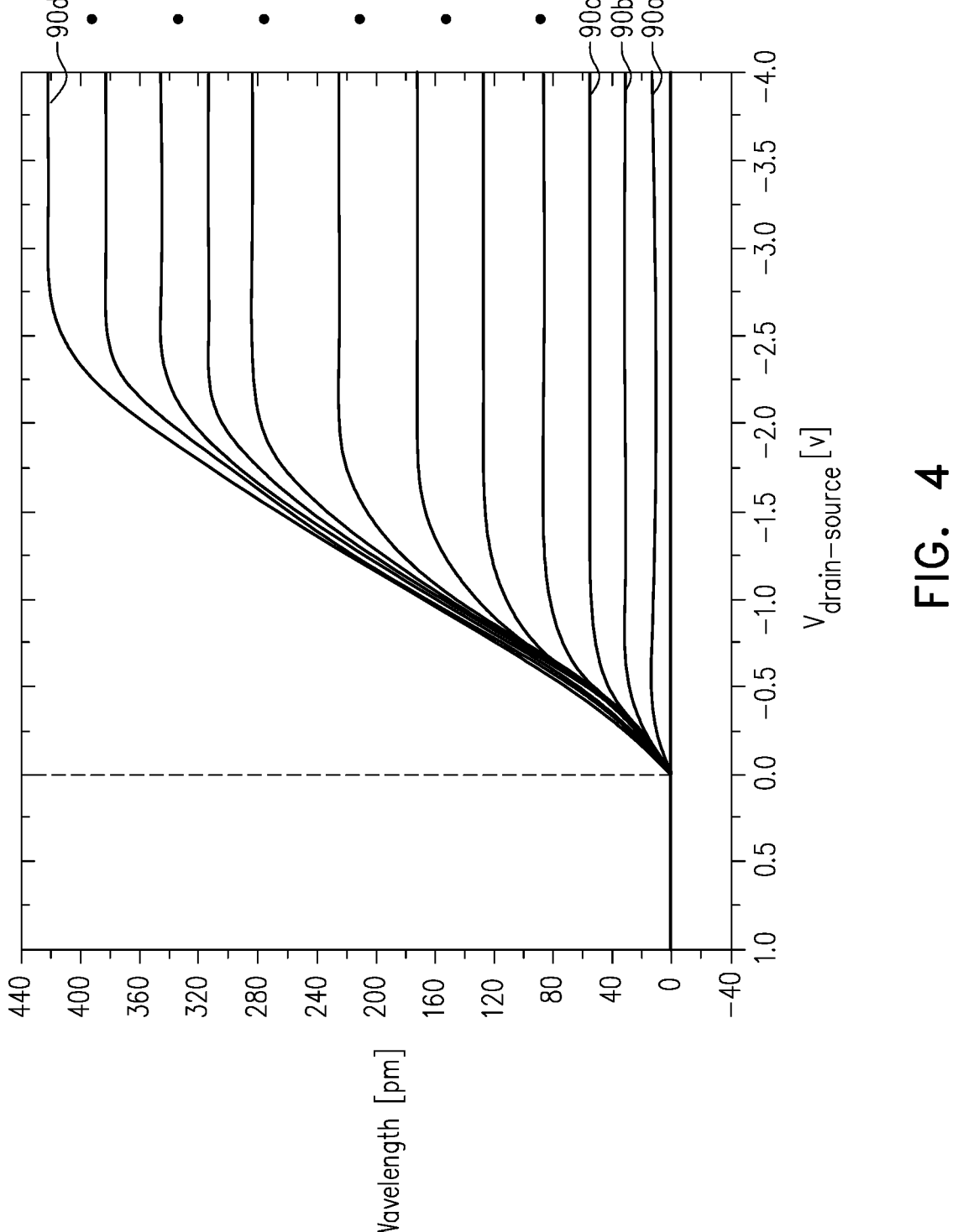
FIG. 4 is a plot that schematically illustrates emission wavelengths of an NV color center in a quantum transistor as a function of voltages applied to the electrodes of the quantum transistor, in accordance with an embodiment of the invention.

The electric field due to the voltage applied to gate electrode 68 also modifies the ZPL wavelength of defect 54. Changing the gate voltage over a small range can thus be used to tune the ZPL wavelength, as shown in FIG. 4, for example over a range of 1-2 nm. Different voltages may be applied to different quantum transistors 22 in system 20 to compensate for ZPL variations due to other, uncontrolled local electric fields, and thus cancel the spectral diffusion among the quantum transistors.

In an alternative embodiment, the charge state and ZPL wavelength of a crystal defect, such as NV defect 54, may be controlled by application of appropriate voltages between electrodes 64, 66 and 68 without incorporating a donor layer and PIN structure in the quantum transistor. In this case, acoustoelectric and/or Stark interactions may be applied in controlling the charge state and ZPL wavelength.

Figure 3A:
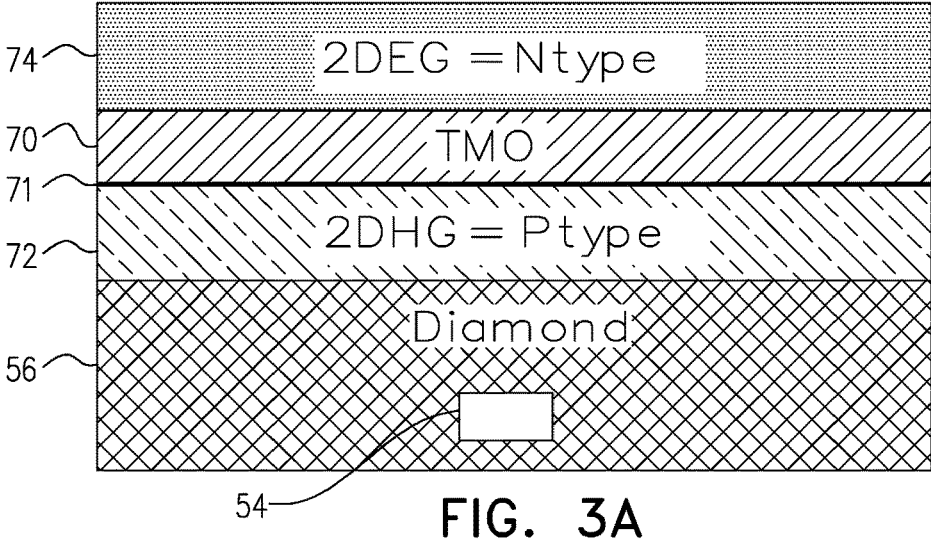
FIGS. 3A, 3B, and 3C are schematic sectional views of semiconductor layers on a diamond crystal in a quantum transistor, in accordance with an embodiment of the invention.

FIG. 3A is a schematic sectional view of semiconductor layers overlying the diamond crystal in quantum transistor 22, in accordance with an embodiment of the invention. Donor layer 70 is deposited over a P-type hydrogen surface termination 71 of the diamond in resonator 56. Application of a voltage to gate electrode 68 across donor layer 70 gives rise to Fermi energy level pinning along the heterostructure between the carriers in a two-dimension hole gas (2DHG) 72 in the subsurface diamond, between the donor layer and defect 54 in diamond resonator 56, and the carriers formed in a two-dimensional electron gas (2DEG) 74 on the oppo-site side of the donor layer. The P-type and N-type layers play the role of acceptor (giving rise to the 2DHG in the diamond subsurface) and donor (giving rise to the 2DEG). These three layers: the P-type and N-type electron gases with the intervening undoped layer, create a two-dimensional PIN structure. Application of a voltage between source electrode 64 and drain electrode 66 will transfer a positive or negative bulk charge from the PIN structure to the diamond bulk, thus switching defect 54 between NV$^0$ and NV$^-$ states, or vice versa.

Figure 3B:
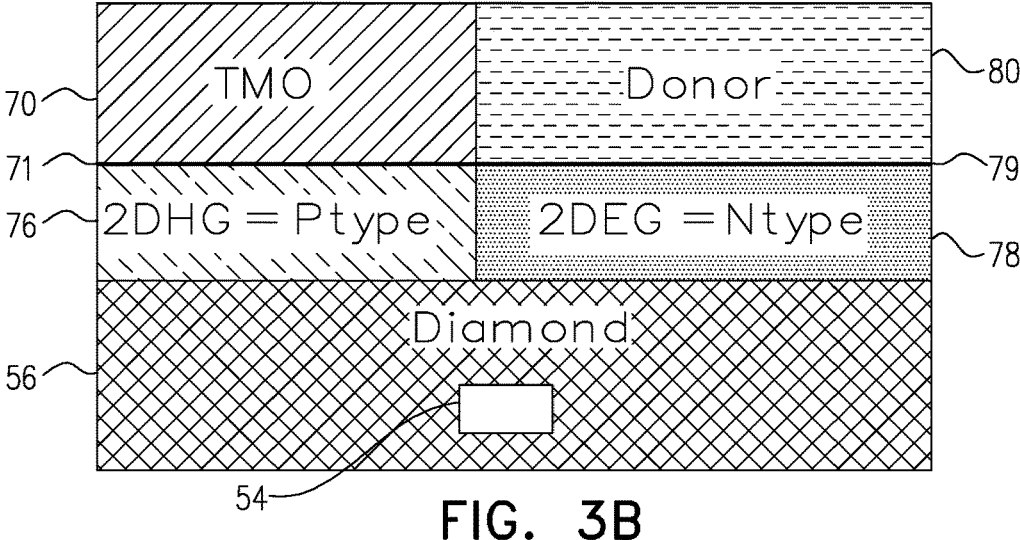

FIG. 3B is a schematic sectional view of semiconductor layers overlying the diamond crystal in quantum transistor 22, in accordance with another embodiment of the invention. In this embodiment, one part of the diamond in resonator 56, with P-type hydrogen surface termination 71, is overlaid by hole donor layer 70. An adjacent part of the diamond, with an N-type nitrogen surface termination 79, is overlaid by an electron donor layer 80. Application of a voltage to gate electrode 68 will give rise to Fermi energy level pinning between a 2DHG 76 and a 2DEG 78 side by side. In other words, the PIN structure in this case is arranged laterally rather than vertically. This structure can be controlled in a similar manner as the structure of FIG. 3A to change the charge state of defect 54 by switching the source-drain voltage.

Figure 3C:
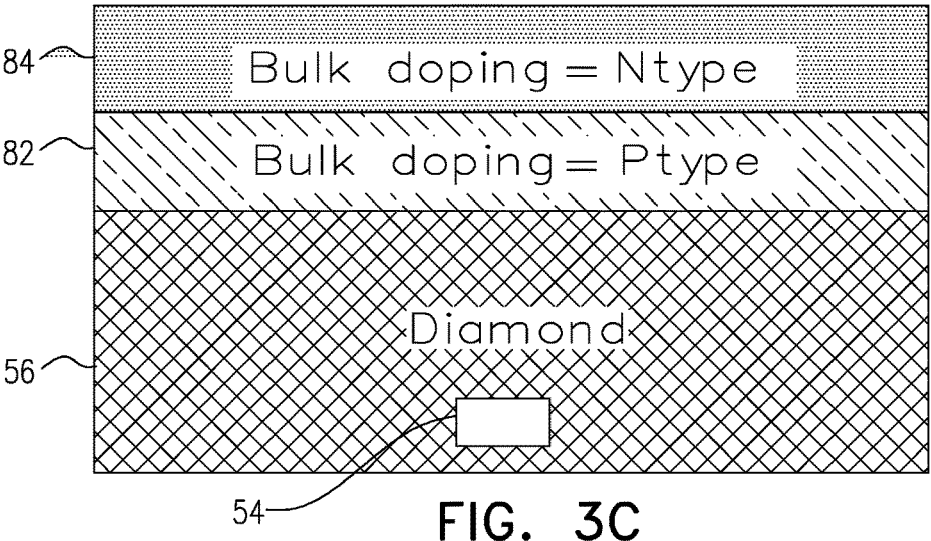

FIG. 3C is a schematic sectional view of doped semiconductor layers in diamond overlying the undoped diamond crystal in quantum transistor 22, in accordance with an alternative embodiment of the invention. In this case, the PIN structure over defect 54 is created by bulk doping of the diamond subsurface, creating a diamond P-type layer 82 and a diamond N-type layer 84. In other words, the PIN structure is based on doped multilayers in the diamond itself, serving as the acceptor and donor layers. Layers 82 and 84 can be formed, for example, by heavily doping thin layers near the surface of the diamond crystal with boron and phosphorus dopants. The thickness of layers 82 and 84 is typically in the range of 1-40 nm. Application of a voltage to gate electrode 68 will give rise to bulk charge in the diamond crystal in a manner similar to the embodiment of FIG. 3A.

FIG. 4 is a plot that schematically illustrates emission wavelengths of an NV color center in quantum transistor 22 as function of voltages applied to a electrodes 64, 66 and 68 of the quantum transistor, in accordance with an embodiment of the invention. The horizontal axis shows the voltage (in volts) applied between drain electrode 66 and source electrode 64. When the voltage is positive, in the region to the left of the dashed vertical line, defect 54 remains in the NV$^0$ charge state and does not emit radiation in the red transition band. (NV$^0$ emission is in a different range at around 575 nm.) When the drain-source voltage is negative, to the right of the dashed vertical line, defect 54 transitions to the NV$^-$ charge state.

In other words, positive drain-source voltage switches quantum transistor 22 off, and negative drain-source voltage switches quantum transistor 22 on, thus enabling qubit operations. Furthermore, continued application of the negative drain-source voltage maintains quantum transistor 22 in the NV$^-$ state and prevents transitions to NV$^0$, thus lengthening the coherence period during which quantum calculations can be carried out.

Each curve 90a, 90b, 90c, . . . , 90d shows the relative emission wavelength as a function of the drain-source voltage for a different value of the voltage applied between gate electrode 68 and source electrode 64. The gate-source voltage increases in increments of 0.2 volts from curve to curve, up to a maximum value of 2.8 volts. In the pictured example, adjustment of the gate-source voltage tunes the ZPL over a range of about 420 μm.

At the conclusion of a quantum computation, control circuitry 34 reads out the spin state of NV defect 54 in each quantum transistor 22. As noted earlier, one way to read out the spin states is to ply one or more excitation beams via input waveguides 28 to the quantum transistors at wavelengths chosen so that NV defects 54 output optical signals to optical detectors 44 and to measure the optical signals.

Alternatively, control circuitry 34 may read out the spin states electronically, by a process of spin-to-charge conversion. For this purpose, input waveguides 28 convey one or more excitation beams to NV defects 54 at wavelengths selected to convert one or more electronic spin states of the NV defect to respective charge states. For example, laser beams at green and near infrared wavelengths (such as 532 nm and 1064 nm) may be applied to preferentially excite and ionize the NV$^-$ |0> spin state, without ionizing the |±1> states. Control circuitry 34 detects the charge state of each NV defect by measuring the current between source electrode 64 and drain electrode 66. High-intensity optical excitation can be applied to read out the photocurrent from each NV defect with high speed and high signal/noise ratio.

Optical Resonators and Filters

Figure 5B:
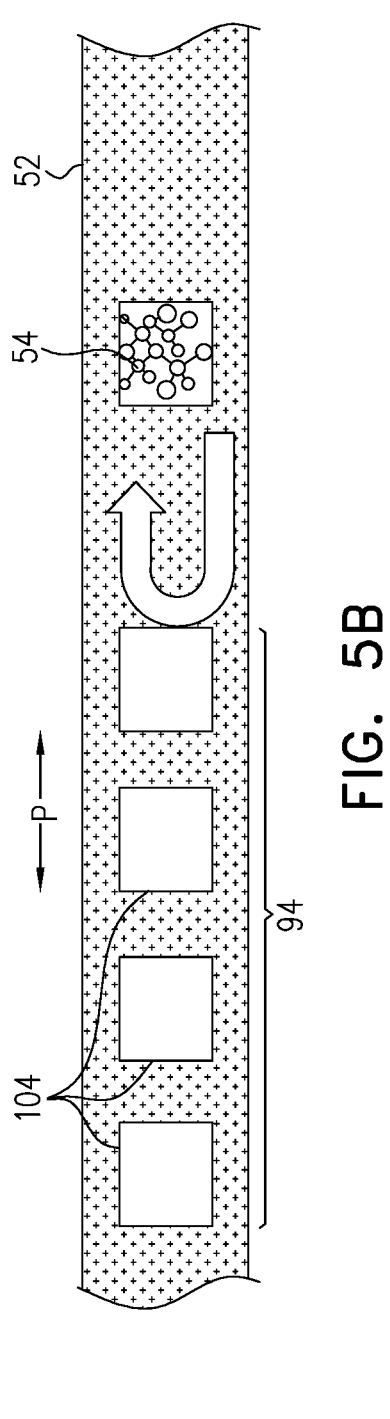
FIG. 5B is a schematic detail view of a periodic structure within the resonator of FIG. 5A, in accordance with an embodiment of the invention.

Reference is now made to FIGS. 5A and 5B, which schematically illustrate optical structures in waveguides 52, 60 and 62 of quantum transistor 22, in accordance with an embodiment of the invention. FIG. 5A is a side view, showing features of optical resonator 56 and of a filter 98 implemented in waveguide 62. FIG. 5B is a detail view of a periodic structure 94 within resonator 52.

Resonator 56 comprises periodic structures 94 and 96 formed in waveguide 52, serving as Bragg reflectors on opposing sides of defect 54. In the present embodiment, these periodic structures comprise holes 104 extending through the diamond waveguide, as illustrated in FIG. 5B. The holes have a period P, which is chosen to reflect light in a band containing the ZPL wavelength. The holes may be filled with air or with another material, such as SiO$_2$. For example, for a narrow diamond waveguide with air holes and surrounded by air, P may be approximately λ/3≅212 nm for the NV$^-$ emission line at 637 nm. To maximize the Purcell enhancement of the ZPL emission, structures 94 and 96 are designed for high Q in the ZPL band, for example Q >2000, and are positioned close together around defect 54 to minimize the optical mode volume V$_m$. (The Purcell enhancement is proportional to Q/V$_m$.) At the same time, for efficient collection of the radiation emitted from defect 54 into waveguide 62, as indicated by arrows 102, it is desirable that periodic structure 94 be fully reflective, while structure 96 is only partially reflective.

One or more excitation beams, for example green laser radiation at 532 nm, as well as orange, red, or infrared radiation, are coupled from waveguide 60 into waveguide 52, as indicated by an arrow 100. This green radiation passes freely through periodic structures 94 and 96. To prevent the green radiation from propagating through output waveguide 36 to detector 44 (FIG. 1), an optical filter 98 is formed in waveguide 62. Filter 98 likewise comprises a periodic structure, but with a period selected to reflect the green radiation back toward overlap region 63.

Figures 6, 7:
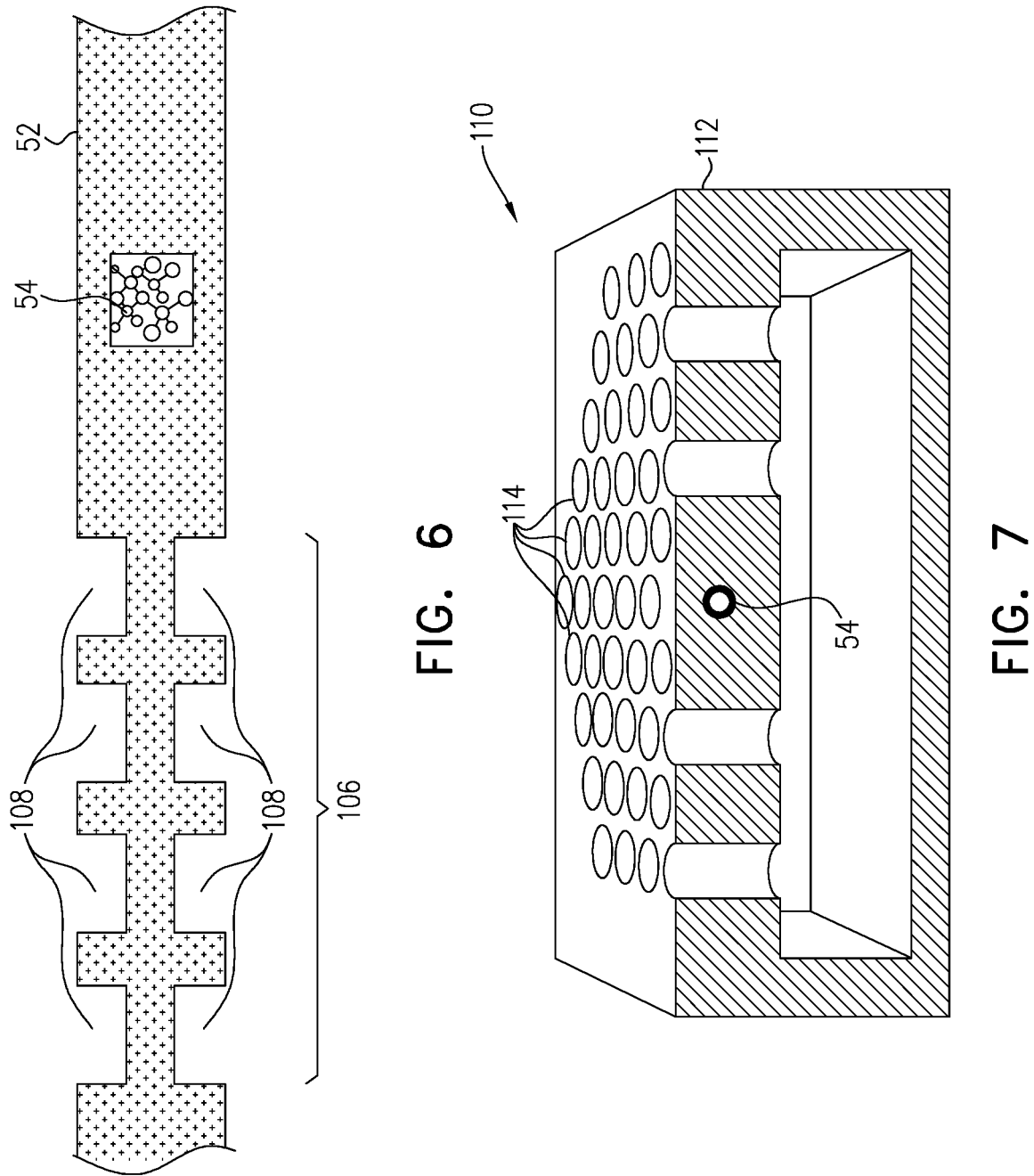
FIG. 6 is a schematic detail view of a periodic structure used in the resonator of a quantum transistor, in accordance with another embodiment of the invention.
FIG. 7 is a schematic sectional view of an optical reso-nator used in a quantum transistor, in accordance with an alternative embodiment of the invention.

FIG. 6 is a schematic detail view of a periodic structure 106 used in the resonator of a quantum transistor, in accordance with another embodiment of the invention. In this case, periodic structure 106 comprises indentations 108 (creating a "fishbone" structure), which may not pass all the way through the diamond waveguide as in the preceding embodiment. This sort of periodic structure may be easier to fabricate than structures based on through-holes. Structure 106 may be made longer than structure 94 (FIGS. 5A/B) to compensate for the lower reflectivity of indentations 108 relative to holes 104. (This lower reflectivity is the result of lower overlap between the edge indentations and the center focused mode of the waveguide.)

Although holes 104 and indentations 108 have rectangular profiles in FIGS. 5B and 6, in alternative implementations the holes and indentations may have other shapes, such as round or oval shapes (not shown in the figures).

FIG. 7 is a schematic sectional view of an optical resonator 110 used in a quantum transistor, in accordance with an alternative embodiment of the invention. To form resonator 110, a two-dimensional pattern of holes 114 is etched through a diamond crystal 112. One or more of the holes are omitted or modified to define an optical cavity containing defect 54. Emission from defect 54 at the ZPL is guided in the horizontal directions by reflection from the periodic structure of holes 114 and in the vertical direction by total internal reflection within diamond crystal 112.

Alternative Embodiments

Figure 8:
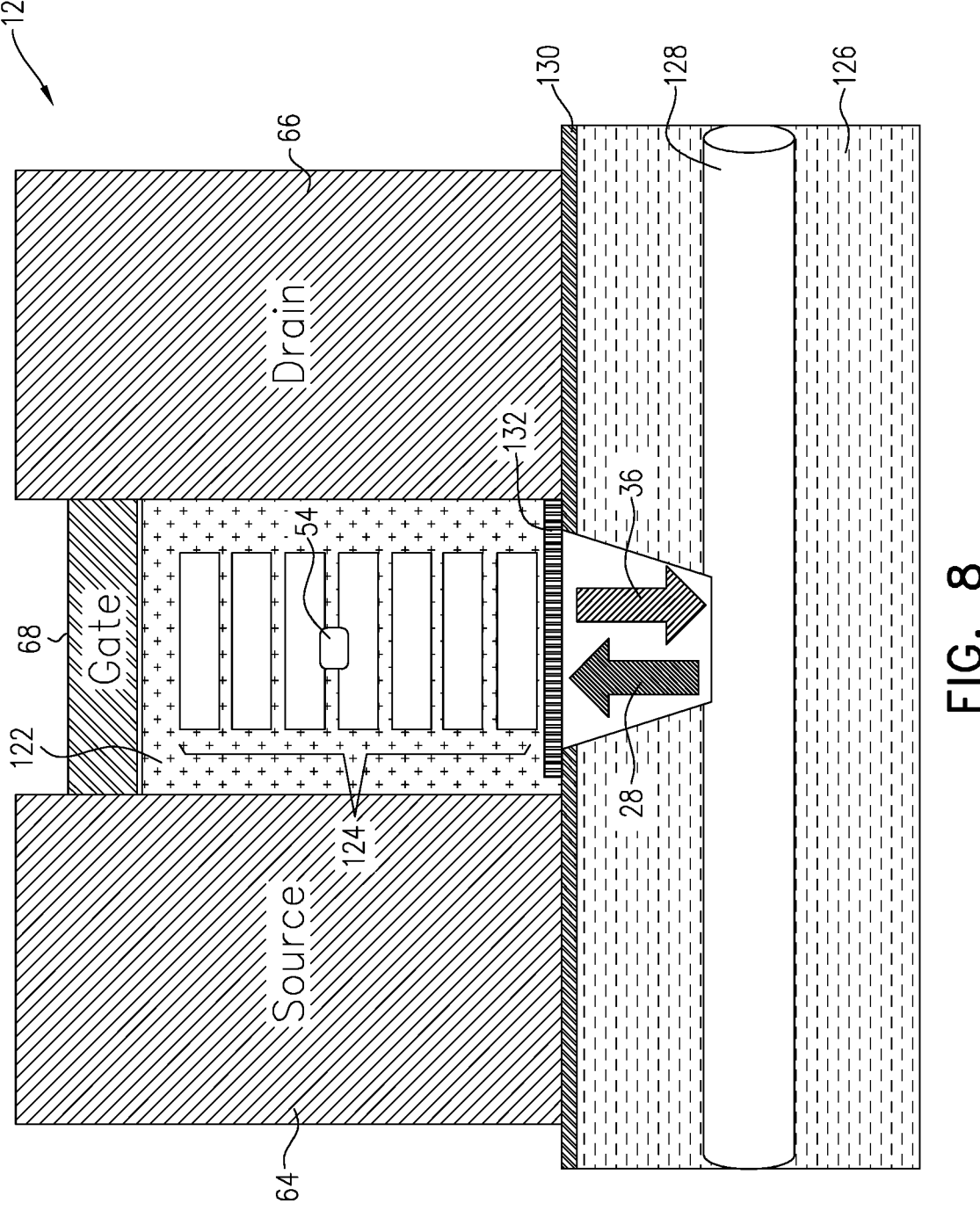
FIGS. 8 and 9 are schematic side views of quantum transistors, in accordance with alternative embodiments of the invention.

FIG. 8 is a schematic side view of a quantum transistor 120, in accordance with an alternative embodiment of the invention. Components of quantum transistor 120 with similar functions to the components of quantum transistor 22, as described above, are labeled with the same indicator numbers.

Quantum transistor 120 comprises a diamond chiplet 122, which is mounted on a PIC 126. Chiplet 122 contains defect 54 within an optical resonator 124, for example a Bragg resonator as described above, which is oriented vertically relative to PIC 126. Electrodes 64, 66 and 68 are formed on opposing sides of chiplet 122, with an intervening donor layer (not shown in this figure) between one or more of electrodes 64, 66 and 68 and the bulk of chiplet 122. The arrangement of the donor and semiconductor layers creates a PIN structure in chiplet 122 as detailed above in reference to FIGS. 3A-C. One or more waveguides 128 on PIC 126 convey light to and from input waveguide 28 and output waveguide 36. A microwave electrode 130 connects to microwave source 30 (FIG. 1) to create a signal that manipulates the ground spin states of defect 54 in the NV⁻ charge state.

A piezoelectric element 132, for example a layer of a suitable piezoelectric crystal, can be actuated by control circuitry 34 (FIG. 1) to modify the effective length of optical resonator 124. Control circuitry 34 is thus able to adjust the resonant wavelength of resonator 124 by applying an appropriate drive voltage to piezoelectric element 132. This sort of piezoelectric resonator adjustment enables control circuitry 34 to tune the ZPL over a range of roughly 1-50 nm, thus compensating for large spectral diffusion if needed.

Figure 9:
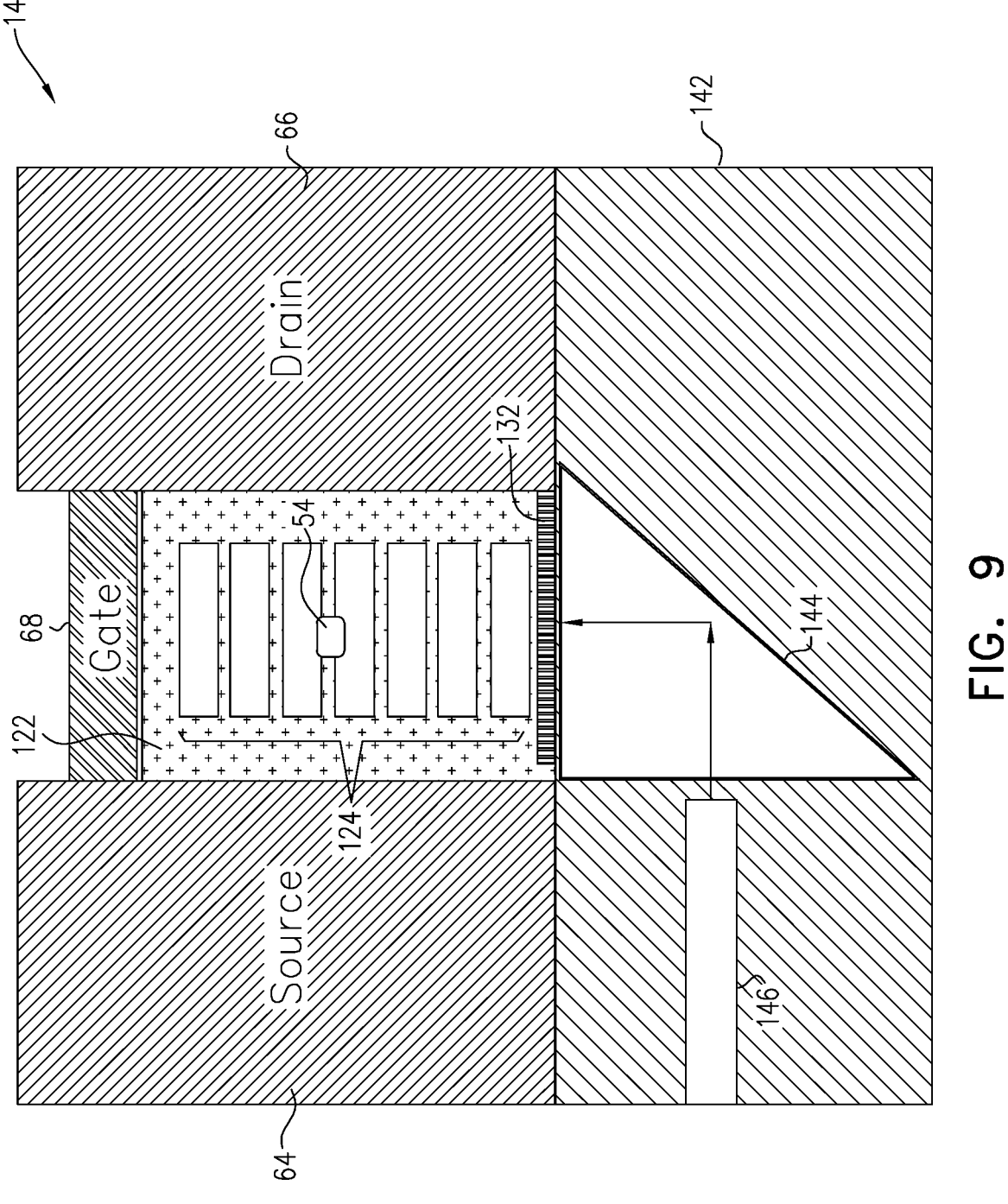

FIG. 9 is a schematic side view of a quantum transistor 140, in accordance with yet another embodiment of the invention. Quantum transistor 140 is similar in design to quantum transistor 120 (FIG. 8), with the addition of a reflective surface 144 on a PIC 142, for coupling optical radiation between diamond chiplet 122 and one or more optical waveguides 146 on PIC 142. Reflective surface 144 may be etched into the PIC substrate at a 45° angle and coated for high reflectivity. This sort of coupling may be more efficient than the adiabatic taper-based couplers described earlier.

The embodiments described above are cited by way of example, and the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A quantum computing device, comprising:
an optical resonator having a resonant wavelength band;
a crystalline material comprising a crystal defect contained within the optical resonator, the crystal defect having a ground state and an excited state, which has an emission wavelength in the resonant wavelength band;
a source electrode and a drain electrode disposed on opposing sides of the crystal defect and configured to apply a first electric field in the crystalline material along a longitudinal axis;
a gate electrode disposed in proximity to the crystal defect and configured to apply to the crystalline material a second electric field transverse to the longitudinal axis;
semiconductor donor and acceptor layers overlying the crystalline material between at least one of the electrodes and the crystal defect; and
control circuitry, which is configured to apply a first voltage between the source and drain electrodes to control a charge state of the crystal defect and to apply a second voltage to the gate electrode to tune the emission wavelength,
wherein application of the first electric field releases carriers from the semiconductor donor layer to the semiconductor acceptor layer in a vicinity of the crystal defect to create a two-dimensional PIN structure over the crystal defect, and switching a polarity of the first voltage switches the charge state of the crystal defect by shifting positive and negative carrier bands in the crystalline material via the PIN structure over the crystal defect.

2. The device according to claim 1, wherein the crystalline material comprises diamond.

3. The device according to claim 2, wherein the crystal defect comprises a nitrogen vacancy (NV) defect.

4. The device according to claim 3, wherein application of the first voltage between the source and drain electrodes switches the NV defect between an $NV^0$ state and an $NV^-$ state.

5. The device according to claim 1, wherein application of the first electric field with a first polarity switches the crystal defect to a first charge state, and application of the first electric field with a second polarity, opposite to the first polarity, switches the crystal defect to a second charge state having the ground state and the excited state, which has the emission wavelength in the resonant wavelength band.

6. The device according to claim 5, wherein the control circuitry is configured to apply the first voltage so as to maintain the crystal defect in the second charge state during a period of quantum computation.

7. The device according to claim 5, and comprising an optical waveguide, which is configured to convey one or more excitation beams to the crystal defect at wavelengths selected to convert one or more electronic spin states of the crystal defect to respective charge states, and wherein the controller is configured to detect the charge states of the crystal defect by measuring a current between the source electrode and the drain electrode.

8. The device according to claim 5, and comprising an optical waveguide, which is configured to convey one or more excitation beams to the crystal defect, including a first excitation beam at a transition wavelength of the second charge state and a second excitation beam at an infrared wavelength chosen to initialize the crystal defect in the second charge state while preventing conversion of the second charge state to the first charge state.

9. The device according to claim 1, wherein the control circuitry is configured to adjust the second voltage so as to tune the emission wavelength of the crystal defect.

10. The device according to claim 1, wherein the semiconductor donor layer comprises one or more of a transition metal oxide (TMO) and a transition metal dichalcogenide (TMD).

11. The device according to claim 1, and comprising a piezoelectric element coupled to modify a length of the optical resonator, wherein the control circuitry is configured to drive the piezoelectric element to adjust the resonant wavelength band of the optical resonator.

12. The device according to claim 1, wherein the optical resonator comprises periodic structures formed in the crystalline material on opposing sides of the crystal defect.

13. The device according to claim 12, wherein the periodic structures comprise holes extending through a layer of the crystalline material that contains the crystal defect.

14. The device according to claim 12, wherein the periodic structures comprise indentations in a surface of the crystalline material.

15. The device according to claim 1, wherein the crystalline material is configured as an optical waveguide, which is coupled to convey optical radiation emitted from the crystal defect at the emission wavelength from the optical resonator to a detector.

16. The device according to claim 15, wherein the optical waveguide is further coupled to convey one or more excitation beams at one or more excitation wavelengths from one or more beam sources to the crystal defect.

17. The device according to claim 16, and comprising:
a substrate, on which the optical waveguide is disposed;
an input waveguide, which is disposed on the substrate and is coupled to inject the one or more excitation beams into the optical waveguide; and
an output waveguide, which is disposed on the substrate and is coupled to receive the emitted optical radiation from the optical waveguide.

18. The device according to claim 17, wherein the optical waveguide and the input and output waveguides have tapered ends, which are overlaid on the substrate so as to inject the one or more excitation beams into the optical waveguide and inject the emitted optical radiation into the output waveguide by adiabatic coupling.

19. The device according to claim 17, wherein the output waveguide comprises a filter configured to block the excitation wavelength.

20. The device according to claim 15, wherein the optical waveguide comprises a ridge disposed on a slab of the crystalline material.

21. The device according to claim 15, wherein the optical waveguide has a cross-sectional profile selected from a group of profiles consisting of a rectangular profile, a triangular profile, and a pentagonal profile.

22. The device according to claim 1, and comprising:
a photonic integrated circuit (PIC) substrate, on which the crystalline material is disposed; and
one or more optical waveguides, which are disposed on the substrate and are optically coupled to the crystalline material.

23. The device according to claim 22, wherein the one or more optical waveguides comprise at least one inverse taper configured to couple optical radiation between the crystalline material and the one or more optical waveguides.

24. The device according to claim 22, wherein the PIC comprises a reflective surface, which is configured to couple optical radiation between the crystalline material and the one or more optical waveguides.

* * * * *